(12) United States Patent
Lee

(10) Patent No.: US 6,498,763 B2
(45) Date of Patent: Dec. 24, 2002

(54) SEMICONDUCTOR MEMORY DEVICE HAVING A MEMORY BLOCK WITH A DECREASED CAPACITANCE

(75) Inventor: Jung Hwa Lee, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/835,812

(22) Filed: Apr. 17, 2001

(65) Prior Publication Data

US 2001/0055235 A1 Dec. 27, 2001

(30) Foreign Application Priority Data

Apr. 17, 2000 (KR) .......................................... 2000-20078

(51) Int. Cl.$^7$ ................................................. G11C 8/00
(52) U.S. Cl. ...................... 365/230.03; 365/51; 365/53; 365/230.06
(58) Field of Search .................... 365/230.03, 230.06, 365/51, 63

(56) References Cited

U.S. PATENT DOCUMENTS

| 4,977,538 | A | * | 12/1990 | Anami et al. | .......... 365/230.03 |
| 5,708,620 | A | * | 1/1998 | Jeong | ................. 365/189.08 |
| 6,081,450 | A | * | 6/2000 | Nawaki | ................. 365/185.11 |

* cited by examiner

Primary Examiner—Hoai Ho
(74) Attorney, Agent, or Firm—Lee & Sterba, P.C.

(57) ABSTRACT

A semiconductor memory device includes a plurality of memory cell arrays. Each of the memory cell arrys includes a plurality of memory blocks. A row decoder is located adjacent to the memory cell array. Capacitance of the memory block becomes smaller as the memory block location becomes farther from the row decoder.

4 Claims, 4 Drawing Sheets

SEMICONDUCTOR MEMORY DEVICE HAVING A MEMORY BLOCK WITH A DECREASED CAPACITANCE

CROSS REFERENCE

This application claims the benefit of Korean Patent Application No. 2000-20078, filed on Apr. 17, 2000, under 35 U.S.C. §119, the entirety of which is hereby incorporated by reference.

BACKGROUND OF THE INVENTION

1. Field of the Invention

The present invention relates to a semiconductor memory device.

2. Description of Related Art

It is very important for semiconductor memory devices such as dynamic random access memory (DRAM) to increase the operation speed and to reduce the production cost and power consumption as the chip size becomes miniaturized.

In such a DRAM, a row address and a column address are synchronized in response to control signals and clock signals and then are sequentially inputted through the same package pins. The inputted row address simultaneously activates a plurality of memory cells that are connected with one word line selected by a row decoder. However, since a plurality of the memory cells that are connected with one word line are arranged in a longitudinal direction of the word line, due to a line resistance of the word line, the farther the memory cell is from the row decoder, the more delayed the activation time of the memory cell is. Therefore, an enable time of the word line depends on an activation time of the farthest memory cell from the row decoder. The activation time of the memory cell affects a row access time (tRAC), thereby lowering an operation speed of the semiconductor memory device.

Further, the memory cell has been gradually miniaturized according to a trend of a high integration, and thus a portion of the word line to which the memory cell is connected is made of not a metal but a polycrystalline silicon, whereupon a word line enable time and a charge sharing time, which greatly affect an activation time of the DRAM, become lengthy.

Furthermore, the memory cell array typically includes a plurality of sub-cell arrays. Even though the numbers of the sub-cell array and sub-word line driver are decreased in order to reduce a chip size, since the number of the memory cells that are connected with the word line increases, a word line activation time becomes lengthier.

FIG. 1 is a plan view illustrating a memory cell array of a semiconductor memory device according to a conventional art. A 256M DRAM includes four memory cell arrays. Each of the memory cell arrays has the capacity of 64M bits. As shown in FIG. 1, the memory cell array 10 includes 16 memory blocks BLK0 to BLK15 and 17 sub-word line drivers SWD0 to SWD16. The sub-word line driver is driven by one row address and includes 8 odd sub-word line drivers SWD1, SWD3 to SWD15 and 9 even word line drivers SWD0, SWD2 to SWD16. Each of the memory blocks includes 4 MOSFET transistors arranged at a crossing point of the 16K sub-word lines SWL and 256 bit line pairs BL/BLB. In other words, one word line SWL is connected with 256 cell transistors, and thus when one word line is selected, 256 cell transistors go to an active state at the same time. The sub-word line is directly connected with a gate electrode of the transistor and is made of polycrystalline silicon.

The sub-word line drivers SWD0 to SWD16 are respectively arranged between a pair of the memory blocks. In other words, a pair of the memory blocks shares one sub-word line driver. The sub-word line drivers are connected with 16K metal word lines WL (not shown in FIG. 1) that are formed over the cell transistor. The odd sub-word line drivers SWD1 to SWD 15 are enable-controlled through first enable drivers PXID0 to PXID7, and the even word line drivers SDW0 to SWD16 are enable-controlled through second enable drivers PXIDB0 to PXIDB8, respectively. Therefore, each of the sub-word line drivers is enabled through the corresponding enable driver and activates the corresponding sub-word line SWL in response to a word line driving signal transmitted via the metal word line WL.

A row decoder RD is arranged at a location adjacent to the memory block BLK15 of the cell array 10. The row decoder RD decodes a row address and generates a first signal PNWEi for activating the selected metal word line WL.

An enable controller PXI provides the first enable drivers PXID0 to PXID7 and the second enable drivers PXIDB0 to PXIDB8 with enable signals through control lines CL and CLB, respectively.

An operation of the word line activation is explained hereinafter. The row decoder RD decodes a row address to select the first signal PNWEi. Then, enable signals are transmitted from the enable controller PXI to either of the first and second enable drivers PXIDi and PXIDBi, respectively, through either the signal line CL or CLB. The enable signals are conveyed to the nearest sub-word line driver SWD15 or SWD16 to the row decoder RD before the others. The enable signals are conveyed to the farthest sub-word line SWD1 or SDW0 to the row decoder RD after the others.

Out of 256 cell transistors that are connected with the sub-word line SWL activated by the sub-word line driver SWD1, the nearest cell transistor CELL255 is the first to be activated, and the farthest cell transistor CELL0 is the last to be activated.

Of 255 cell transistors that are connected with the sub-word line SWL activated by the sub-word line driver SWD1, the nearest cell transistor CELL255 is the first to be activated, and the farthest cell transistor CELL0 is the last to be activated.

Since the sub-word line SWL is made of polycrystalline silicon that is greater in resistance than a metal, the cell transistor CELL255 of the sub-word line SWL is activated by the sub-word line driver SWD1 is activated before the cell transistor CELL0 of the sub-word line SWL activated by the sub-word line driver SWD15. Therefore, as shown in FIG. 2, a word line activation time is delayed up -to an activation time of the cell transistor CELL0 of the sub-word line SWD1, thereby increasing a row access time (tRAC) and a row precharge time (tRP). FIG. 2 is a timing diagram illustrating wave forms of sub-word lines. At this point, the vertical axis denotes voltage, and the horizontal axis represents time.

In case of high-integrated DRAM having the capacity of 1G, 4G, or 16G bits, a delay difference between the earliest cell transistor and the latest cell transistor becomes greater, thereby increasing a word line activation time length.

For the foregoing reasons, there is a need for a semiconductor memory device having a short word line activation time length.

SUMMARY OF THE INVENTION

According to a feature of an embodiment of the present invention, there is provided a semiconductor memory device having a short word line activation time length. According to another feature of an embodiment of the present invention, there is provided a semiconductor memory device having a plurality of memory cell arrays, each of the memory cell arrays having a plurality of memory blocks. Each of the memory blocks has a plurality of transistors. According to another feature of the present invention, the semiconductor memory device further includes a row decoder located adjacent to the memory cell array. According to yet another feature of the present invention, a capacitance of a memory block becomes smaller as the memory block becomes farther from the row decoder.

According to another feature of an embodiment of the present invention, the memory cell array further includes a word line activated by the row decoder. The word line includes a plurality of sub-word lines. Each of the sub-word lines is connected with the plurality of the transistors. A plurality of sub-word line drivers activate the sub-word lines. A plurality of enable drivers enable the sub-word line drivers. An enable controller provides the plurality of the enable drivers with enable signals. One sub-word line of the farthest memory block from the row decoder is connected with 224 transistors, and one sub-word line of the nearest memory block to the row decoder is connected with 288 transistors.

According to another feature of an embodiment of the present invention, each of the memory cell arrays includes 3 memory blocks having 224 transistors per one sub-word line, 3 memory blocks having 240 transistors per one sub-word line, 4 memory blocks having 256 transistors per one sub-word line, 3 memory blocks having 272 transistors per one sub-word line, and 3 memory blocks having 288 transistors per one sub-word line.

Using the semiconductor memory device according to features of preferred embodiments of the present invention, a word line activation time can be reduced, thereby decreasing a row access time (tRAC) and a row precharge time (tRP) leading to a high-speed operation.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to a preferred embodiment of the present invention, example of which is illustrated in the accompanying drawings.

Figure 3:
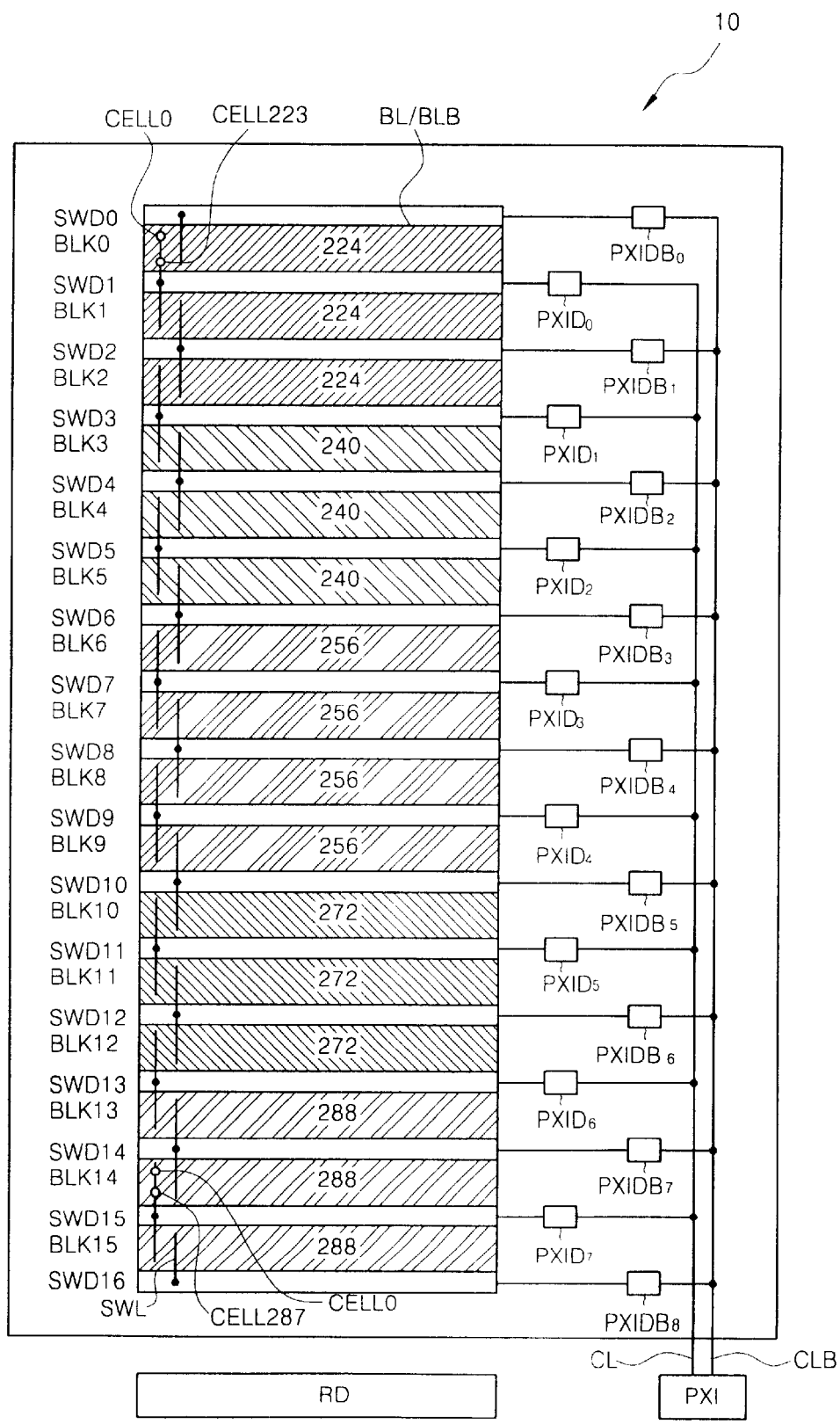
FIG. 3 is a plan view illustrating a memory cell array of a semiconductor memory device according to a preferred embodiment of the present invention.

FIG. 3 is a plan view illustrating a memory cell array of a semiconductor memory device according to a preferred embodiment of the present invention. Each of the memory cell arrays has the capacity of 64M bits. As shown in FIG. 3, the memory cell array 10 includes memory blocks BLK0 to BLK15 and sub-word line drivers SDW0 to SWD16. The sub-word line driver is driven by one row address and includes 8 odd sub-word line drivers SWD1, SWD3 to SWD15 and 9 even sub-word line drivers SWD0, SWD2 to SWD16.

The sub-word line drivers SDW0 to SWD16 are arranged between a pair of the memory blocks. In other words, a pair of the memory blocks shares one sub-word line driver. The sub-word line drivers are connected with 16K metal word lines WL (not shown) that are formed over the cell transistors. The odd sub-word line drivers SWD1 to SWD 15 are enable-controlled through first enable drivers PXID0 to PXID7, and the even word line drivers SDW0 to SWD16 are enable-controlled through second enable drivers PXIDB0 to PXIDB8, respectively. Therefore, each of the sub-word line drivers is enabled through the corresponding enable driver and activates the corresponding sub-word line SWL in response to a word line operating signal transmitted via the metal word line WL.

A row decoder RD is arranged at a location adjacent to the memory block BLK15 of the cell array 10. The row decoder RD decodes a row address and generates a first signal PNWEi for activating the selected metal word line WL.

An enable controller PXI provides the first enable drivers PXID0 to PXID7 and the second enable drivers PXIDB0 to PXIDB8 with enable signals through control lines CL and CLB, respectively.

Each of the memory blocks BLK0 to BLK15 includes a plurality of transistors arranged at a crossing point of the sub-word lines SWL and bit lines pairs BL/BLB. However, the number of the transistors included in each of the memory blocks differs from each other. In other words, the nearest memory blocks BLK15 to the row decoder RD includes the most transistors, and the farthest memory blocks BLK0 from the row decoder RD includes the least transistors. That is, as the memory block become farther from the row decoder RD, the number of bit line pairs BL/BLB that are connected with the sub-word line decreases. As shown in FIG. 3, each of the memory blocks BLK0 to BLK2 includes 224 transistors, and each of the memory blocks BLK3 to BLK5 includes 240 transistors, and each of the memory blocks BLK6 to BLK9 includes 256 transistors per the sub-word line, and each of the memory blocks BLK10 to BLK12 includes 272 transistors per the sub-word line, and each of the memory blocks BLK13 to BLK15 includes 288 transistors per the sub-word line.

As described above, if the memory cell array is formed in such a manner that the memory blocks have different capacitance with the capacitance of the memory block becoming smaller as it becomes farther from the row decoder, an activation time difference between the nearest cell transistor and the farthest cell transistor can be decreased, thereby reducing a word line activation time length.

An operation of the word line activation is explained hereinafter. First, enable signals are conveyed along the control line CL from an enable controller PXI to the nearest enable driver PXID7 before the others with the farthest enable driver PXID0 conveyed at the end. Subsequently, the row decoder RD decodes a row address to select the word line WL, such that the selected word line WL is activated. Word line driving signals are conveyed along the metal word line WL to the nearest sub-word line driver SWD15 before the others with the farthest sub-word line driver SWD1 conveyed at the end.

Out of 288 cell transistors that are connected with the sub-word line (SWL) activated by the sub-word line driver SWD15, the nearest cell transistor CELL287 is the first to be activated and the farthest cell transistor CELL0 is the last to be activated. Further, out of 224 transistors that are connected to the sub-word line (SWL) activated by the sub-word line driver SWD1, the nearest cell transistor CELL223 is the first to be activated and the farthest cell transistor CELL0 is the last to be activated.

Figure 1:
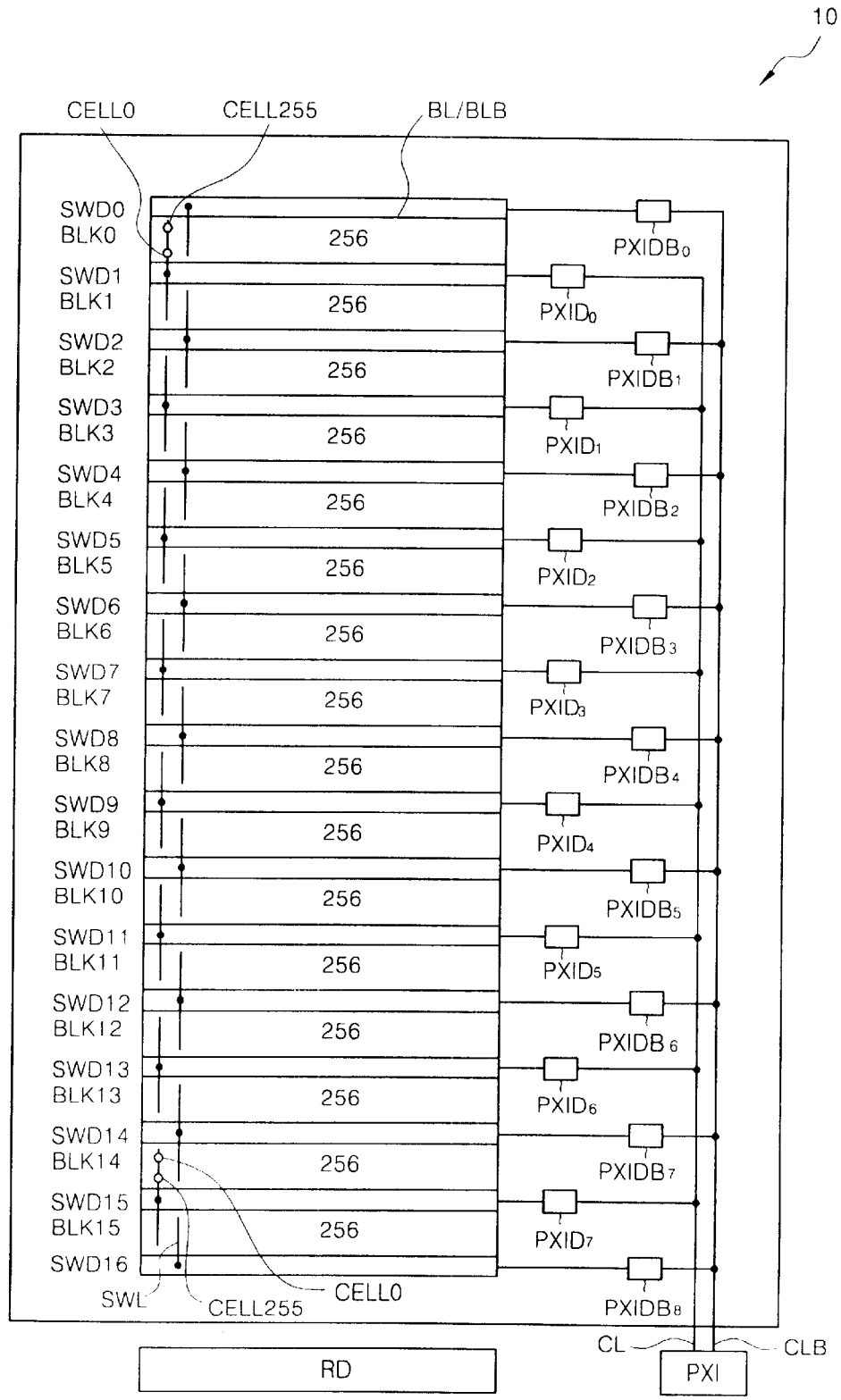
FIG. 1 is a plan view illustrating a memory cell array of a semiconductor memory device according to a conventional art.
Figure 2:
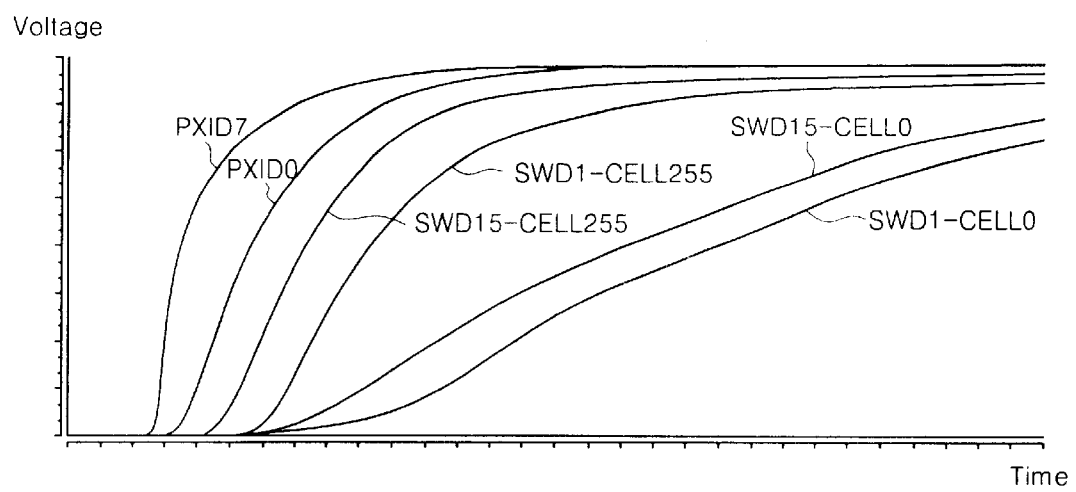
FIG. 2 is a time diagram illustrating wave forms of word lines of the semiconductor memory device according to the conventional art.
Figure 4:
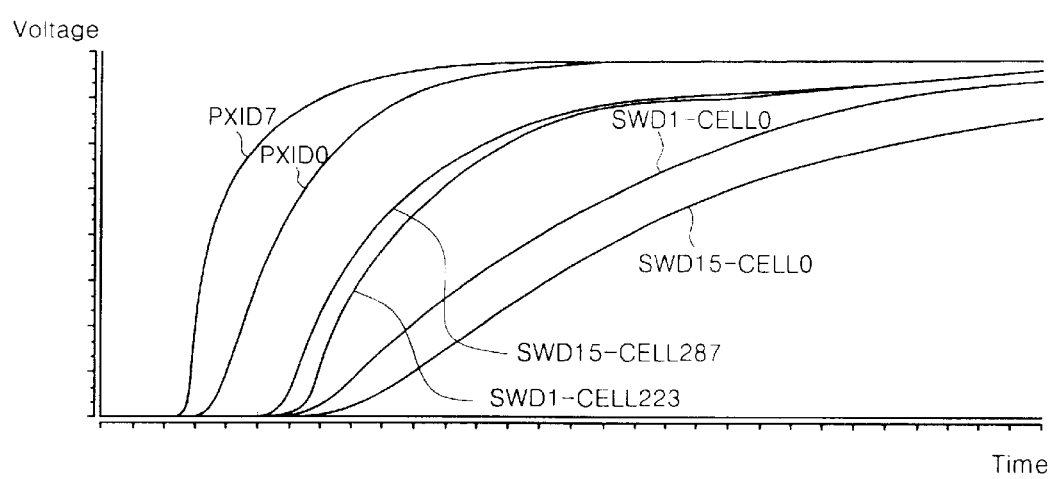
FIG. 4 is a time diagram illustrating wave forms of word lines of the semiconductor memory device according to the preferred embodiment of the present invention.

At this time, in the farthest memory blocks, a time required to activate 32 transistors is decreased, and in the nearest memory blocks, a time required to activate 32 transistors increases as compared with the memory cell arrays according to the conventional art. Therefore, as shown in FIG. 4, the farthest transistor CELL0 that is connected to the sub-word line (SWL) activated by the nearest sub-word line driver SWD15 is activated after the farthest transistor CELL0 that is connected to the sub-word line activated by the sub-word line driver SWD1. At this point, FIG. 4 is a timing diagram illustrating wave forms of sub-word lines according to the preferred embodiment of the present invention. At this point, the vertical axis denotes voltage, and the horizontal axis represents time. As seen in FIGS. 2 and 4, a word line activation time of the memory cell array according to the present invention is faster when compared to that of the conventional memory cell array.

As described herein before, using the semiconductor memory device according to features of preferred embodiments of the present invention, a word line activation time can be reduced, thereby decreasing a row access time (tRAC) and a row precharge time (tRP) leading to a high-speed operation.

While the invention has been particularly shown and described with reference to features of preferred embodiments thereof, it will be understood by those skilled in the art that the foregoing and other changes in form and detail may be made therein without departing from the spirit and scope of the invention with the true scope of the present invention being defined by the appended claims.

What is claimed is:

1. A semiconductor memory device, comprising:

a plurality of memory cell arrays, each memory cell array having a plurality of memory blocks, each memory block having a plurality of transistors; and a row decoder located adjacent to each memory cell array, wherein capacitance of a memory block is made smaller by decreasing the number of transistors (cells) in the memory block as the memory block becomes farther from the row decoder.

2. The semiconductor memory device of claim 1, wherein each of the memory cell arrays further includes:

a word line activated by the row decoder, including a plurality of sub-word lines, each of the sub-word lines connecting with the plurality of the transistors;

a plurality of sub-word line drivers for activating the sub-word lines;

a plurality of enable drivers for enabling the sub-word line drivers; and an enable controller for providing the plurality of the enable drivers with enable signals.

3. The semiconductor memory device of claim 2, wherein one sub-word line of the farthest memory block from the row decoder is connected to 224 transistors, and one sub-word line of the nearest memory block to the row decoder is connected to 288 transistors.

4. The semiconductor memory device of claim 2, wherein each of the memory cell arrays includes 3 memory blocks having 224 transistors per one sub-word line, 3 memory blocks having 240 transistors per one sub-word line, 4 memory blocks having 256 transistors per one sub-word line, 3 memory blocks having 272 transistors per one sub-word line, and 3 memory blocks having 288 transistors per one sub-word line.

* * * * *